(12) United States Patent
Huang et al.

(10) Patent No.: US 12,232,375 B2
(45) Date of Patent: Feb. 18, 2025

(54) DISPLAY PANEL AND METHOD FOR MANUFACTURING SAME, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Weiyun Huang, Beijing (CN); Yuanyou Qiu, Beijing (CN); Yao Huang, Beijing (CN); Tianyi Cheng, Beijing (CN); Yue Long, Beijing (CN); Meng Zhao, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 750 days.

(21) Appl. No.: 17/478,122

(22) Filed: Sep. 17, 2021

(65) Prior Publication Data

US 2022/0102472 A1 Mar. 31, 2022

(30) Foreign Application Priority Data

Sep. 28, 2020 (CN) .......................... 202011041108.7

(51) Int. Cl.
*H10K 59/131* (2023.01)
*H10K 50/84* (2023.01)
*H10K 59/122* (2023.01)
*H10K 59/65* (2023.01)
*H10K 71/00* (2023.01)

(52) U.S. Cl.
CPC .......... *H10K 59/131* (2023.02); *H10K 50/84* (2023.02); *H10K 59/122* (2023.02); *H10K 59/65* (2023.02); *H10K 71/00* (2023.02)

(58) Field of Classification Search
CPC .......................... H10K 59/122; H10K 59/131
See application file for complete search history.

(56) References Cited

U.S. PATENT DOCUMENTS

2015/0097171 A1* 4/2015 Kim ................. H10K 59/80524
  438/23
2021/0167320 A1* 6/2021 Kim ..................... H10K 71/621

* cited by examiner

*Primary Examiner* — Douglas M Menz
(74) *Attorney, Agent, or Firm* — IPro, PLLC (57) ABSTRACT

A display panel includes a substrate and a light-emitting structure layer, wherein the light-emitting structure layer includes an anode layer, a light-emitting layer, and a cathode layer that are sequentially stacked on the substrate; the cathode layer has a patterned area which is disposed in a light-transmitting display area of the display panel; the patterned area includes a plurality of cathode structures which are spaced apart from each other; an orthographic projection of each of the cathode structures onto the substrate covers an orthographic projection of the light-emitting structure of at least one OLED device onto the substrate.

18 Claims, 8 Drawing Sheets

DISPLAY PANEL AND METHOD FOR MANUFACTURING SAME, AND DISPLAY APPARATUS

CROSS-REFERENCE TO RELATED APPLICATION

This application is based on and claims priority to Chinese Patent Application No. 202011041108.7, filed on Sep. 28, 2020 and entitled "DISPLAY PANEL AND METHOD FOR MANUFACTURING SAME", the disclosure of which is herein incorporated by reference in its entirety.

TECHNICAL FIELD

The present disclosure relates to the field of display technologies, and more particularly, to a display panel and a method for manufacturing the same, and a display apparatus.

BACKGROUND

The organic electro-luminescent displays (OLEDs) have gradually become a mainstream in the display field due to its excellent performance such as low power consumption, high color saturations, wide viewing angles, low thicknesses and high flexibility, and thus can be widely used in terminal products like smart phones, tablet computers, and televisions.

SUMMARY

The embodiments of the present disclosure provide a display panel and a method for manufacturing the same, and a display apparatus.

According to an aspect of the present disclosure, a display panel is provided. The display panel includes a substrate and a light-emitting structure layer, wherein the light-emitting structure layer includes a plurality of OLED devices distributed on the substrate; each OLED device has a light-emitting structure which includes an anode layer, a light-emitting layer and a cathode layer that are sequentially stacked on the substrate; the cathode layer has a patterned area the patterned area of the cathode layer includes a plurality of cathode structures which are spaced apart from each other; an orthographic projection of each of the cathode structures onto the substrate covers an orthographic projection of the light-emitting structure of at least one of the OLED devices onto the substrate; and wherein the patterned area is located in a light-transmitting display area of the display panel.

Optionally, the orthographic projection of each of the cathode structures onto the substrate covers the orthographic projection of the light-emitting structure of one of the OLED devices onto the substrate.

Optionally, the display panel further includes a plurality of wirings and a VSS signal line that are connected with each other, wherein at least part of the VSS signal line is disposed on an edge of the display panel; and each of the cathode structures is connected to one corresponding wiring, so as to be connected to the VSS signal line through the connected wiring.

Optionally, the wirings include first wirings which are disposed in a same layer as the anode layer; and the display panel further includes: a pixel defining layer, wherein the pixel defining layer is disposed on the substrate and defines a plurality of openings, and at least part of each OLED device is disposed in a corresponding opening; at least part of each cathode structure is disposed on a surface of the pixel defining layer; the pixel defining layer is provided with via holes that penetrate through the pixel defining layer; and the first wirings are connected to corresponding cathode structures through the via holes.

Optionally, the wirings include second wirings; and the display panel further includes a first planarization layer, a second planarization layer and a pixel defining layer;

the first planarization layer and the second planarization layer are disposed between the substrate and the OLED devices, and the second planarization layer is disposed closer to the OLED devices; the second wirings are disposed between the first planarization layer and the second planarization layer;

the pixel defining layer is disposed on a surface of the second planarization layer distal from the substrate and defines a plurality of openings; at least part of each OLED device is disposed in a corresponding opening, and at least part of each cathode structure is disposed on a surface of the pixel defining layer; the second planarization layer and the pixel defining layer are provided with via holes that penetrate through the second planarization layer and the pixel defining layer; and the second wirings are connected to corresponding cathode structures through the via holes.

Optionally, the VSS signal line extends from the edge of the display panel to the patterned area; the plurality of cathode structures are distributed on both sides of the patterned area located in the light-transmitting display area; one part of the second wirings are sequentially arranged at intervals along a direction away from the edge, and are respectively connected to the cathode structures on one side of the VSS signal line, and the other part of the second wirings are sequentially arranged at intervals along a direction away from the edge, and are respectively connected to the cathode structures on the other side of the VSS signal line.

Optionally, the second wirings are transparent wirings.

Optionally, the display panel further includes: a conductive structure layer, wherein the conductive structure layer is disposed in the via holes and connected to the second wirings and the cathode structures respectively.

Optionally, the conductive structure layer is disposed in a same layer as the anode layer.

Optionally, the display area of the display panel includes a first display area, a second display area, and a third display area, the first display area surrounding the second display area and the third display area surrounding the first display area; the second display area is disposed directly opposite to a camera under panel; and the patterned area is located in the second display area; and the first display area includes a first pixel unit and a second pixel unit, wherein the first pixel unit includes a first pixel circuit, and the second pixel unit includes a second pixel circuit and a first OLED device; the second display area includes a third pixel unit which includes a second OLED device; and the display panel further includes: a plurality of third wirings configured to connect a drain of the first pixel circuit to an anode of the second OLED device corresponding to the first pixel circuit.

Optionally, the third wirings are transparent wirings.

Optionally, the second wirings and the third wirings are disposed in a same layer and insulated from each other.

Optionally, the display panel further includes: an encapsulating layer, wherein the encapsulating layer includes a plurality of encapsulating structures which are spaced apart from each other and are in one-to-one correspondence with the plurality of cathode structures; and an orthographic projection of each of the encapsulating structures onto the substrate covers an orthographic projection of one corresponding cathode structure onto the substrate.

Optionally, the patterned area includes an entire display area of the display panel, and the orthographic projection of each of the cathode structures onto the substrate covers the orthographic projection of the light-emitting structure of one of the OLED devices onto the substrate; and the display panel further includes an encapsulating layer, a VSS signal line and a plurality of first wirings; wherein the encapsulating layer includes a plurality of encapsulating structures which are spaced apart from each other and in one-to-one correspondence with the plurality of cathode structures; the orthographic projection of each of the encapsulating structures onto the substrate covers the orthographic projection of one corresponding cathode structure onto the substrate; at least part of the VSS signal line is disposed on an edge of the display panel; and the first wirings are disposed in a same layer as the anode layer; and each of the cathode structures is connected to one corresponding first wiring, so as to be connected to the VSS signal line through the connected first wiring.

According to another aspect of the present disclosure, a method for manufacturing the aforementioned display panel is provided. The method includes: forming a light-emitting structure layer on a surface of a substrate, wherein the light-emitting structure layer includes a plurality of OLED devices distributed on the substrate; each OLED device has a light-emitting structure which includes an anode layer, a light-emitting layer and a cathode layer that are sequentially stacked on the substrate; and the cathode layer has a patterned area which is located in a light-transmitting display area of the display panel; the cathode layer in the patterned area includes a plurality of cathode structures that are spaced apart from each other; and an orthographic projection of each of the cathode structures onto the substrate covers an orthographic projection of the light-emitting structure of at least one of the OLED devices onto the substrate.

Optionally, the method further includes: forming an encapsulating layer on the light-emitting structure layer, wherein the encapsulating layer includes a plurality of encapsulating structures which are arranged spaced apart from each other and are in one-to-one correspondence with the plurality of cathode structures; and an orthographic projection of each of the encapsulating structures onto the substrate covers an orthographic projection of one corresponding cathode structure onto the substrate.

Optionally, the method further includes: forming a first planarization layer on a side of the substrate proximal to the OLED devices; forming a plurality of second wirings on a surface of the first planarization layer distal from the substrate, wherein each of the cathode structures is provided with one corresponding second wiring, and the second wirings are configured to connect the cathode structures to the VSS signal line; forming a second planarization layer on a surface of the first planarization layer distal from the substrate, wherein the second planarization layer covers the plurality of second wirings; forming a pixel defining layer on a surface of the second planarization layer distal from the substrate, wherein the pixel defining layer defines a plurality of openings; the OLED devices are disposed in the openings, and at least part of each cathode structure overlaps with a surface of the pixel defining layer; and forming via holes penetrating through the second planarization layer and the pixel defining layer, in the second planarization layer and the pixel defining layer, wherein at least partial surface of each second wiring is exposed by a corresponding via hole.

Optionally, the method further includes: forming a conductive structure layer in the via holes, wherein the conductive structure layer is electrically connected to the second wirings and the cathode structures respectively.

Optionally, the display panel includes a first display area, a second display area, and a third display area, the first display area surrounding the second display area, the third display area surrounding the first display area, and the second display area being opposite to a camera under panel; the patterned area is located in the second display area; the first display area includes a first pixel unit and a second pixel unit, wherein the first pixel unit includes a first pixel circuit, and the second pixel unit includes a second pixel circuit and a first OLED device; the second display area includes a third pixel unit which includes a second OLED device; and the method further includes: forming a plurality of third wirings, the plurality of third wirings being configured to electrically connect a drain of the first pixel circuit to an anode of the second OLED device, so as to drive the connected second OLED device to emit light through the first pixel circuit, wherein the third wirings and the second wirings are formed by a same process step.

According to yet another aspect of the present disclosure, a display apparatus is provided, including a display panel and a power supply component configured to supply power to the display panel, wherein the display panel includes a substrate and a light-emitting structure layer, the light-emitting structure layer includes an anode layer, a light-emitting layer and a cathode layer that are sequentially stacked on the substrate; the light-emitting structure layer includes a plurality of OLED devices distributed on the substrate; each OLED device has a light-emitting structure; the cathode layer has a patterned area; the cathode layer in the patterned area includes a plurality of cathode structures which are spaced apart from each other; an orthographic projection of each of the cathode structures onto the substrate covers an orthographic projection of the light-emitting structure of at least one of the OLED devices onto the substrate; wherein the patterned area is located in a light-transmitting display area of the display panel.

DETAILED DESCRIPTION

The embodiments of the present disclosure are described in detail below. The embodiments described below are intended to be exemplary only, and are only intended to explain the present disclosure, rather than being construed as limitations to the present disclosure.

If specific techniques or conditions on which procedures are based are not indicated in the embodiments, the procedures shall be carried out in accordance with the techniques or conditions described in the literature in the art or in accordance with the product specification.

Figure 1:
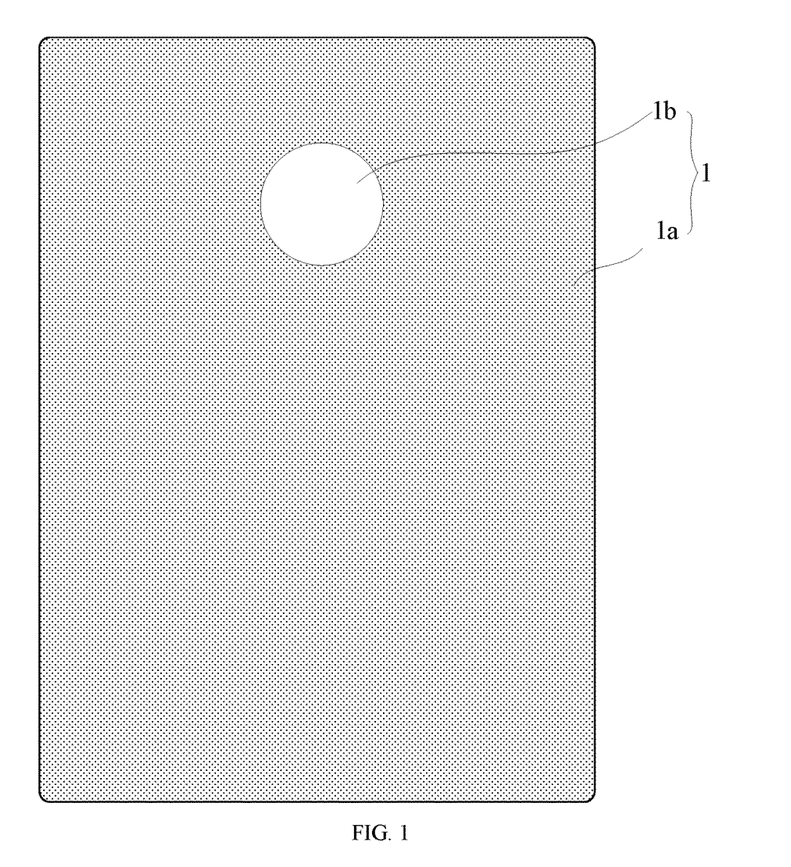
FIG. 1 is a schematic structural diagram of a display area of a display panel according to an embodiment of the present disclosure.

Display panels are provided in the embodiments of the present disclosure. FIG. 1 is a schematic structural diagram of a display area of a display panel according to an embodiment of the present disclosure. As shown in FIG. 1, the display panel is provided with a display area 1. The display area 1 includes a light-transmitting display area 1b, and the remainder of the display area 1 is a light-proof display area 1a. Alternatively, in some other embodiments, the entire display area of the display panel is the light-transmitting display area 1b.

Here, the light-transmitting display area refers to an area where an image can be displayed and light can pass through the area of the display panel from one side of the display panel to the other side of the display panel.

It should be noted that, in addition to the display area 1, the display panel further includes a boundary area surrounding the display area, which is also referred to as a peripheral area (not shown in FIG. 1).

Figure 2:
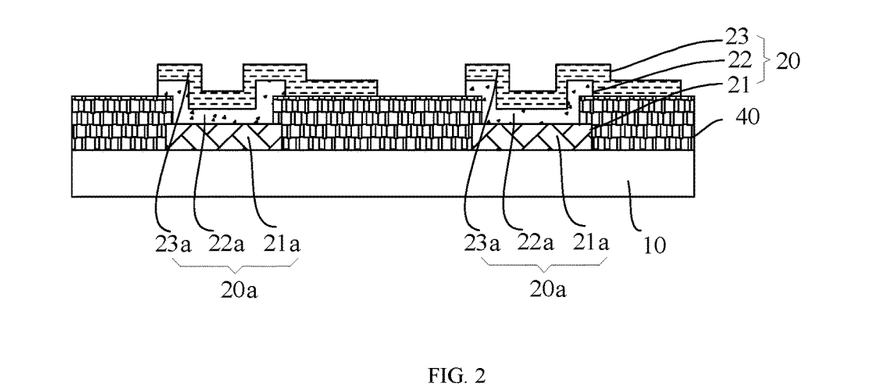
FIG. 2 is a schematic diagram showing a laminated structure of a display panel according to an embodiment of the present disclosure.

FIG. 2 is a schematic diagram showing a laminated structure of a display panel according to an embodiment of the present disclosure. FIG. 2 shows a partial structure of the light-transmitting display area of the display panel. Referring to FIG. 2, the display panel includes a substrate 10 and a light-emitting structure layer 20. The light-emitting structure layer 20 includes an anode layer 21, a light-emitting layer 22, and a cathode layer 23 that are sequentially stacked on the substrate 10. The light-emitting structure layer 20 includes a plurality of OLED devices 20a disposed on the substrate 10, wherein each OLED device 20a includes an anode 21a, a light-emitting structure 22a, and a cathode that are sequentially stacked. The anode 21a is disposed in the anode layer 21, the light-emitting structure 22a is disposed in the light-emitting layer 22, and the cathode is disposed in the cathode layer 23.

Figure 3:
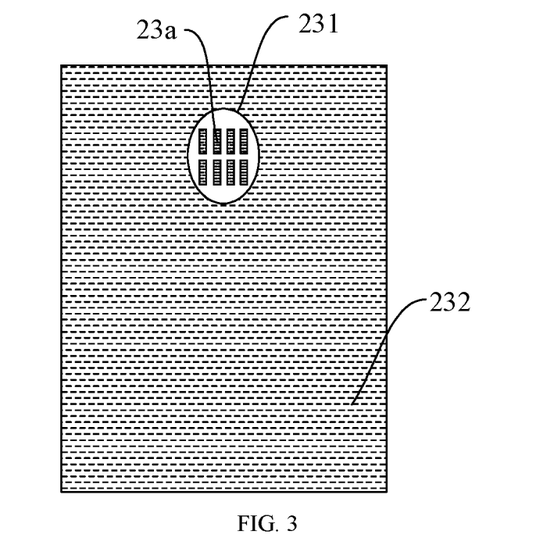
FIG. 3 is a plan view schematic structural diagram of a cathode layer according to an embodiment of the present disclosure.

FIG. 3 is a schematic structural diagram of a cathode layer according to an embodiment of the present disclosure. In conjunction with FIG. 3, the cathode layer 23 has a patterned area 231. The patterned area 231 is disposed within the light-transmitting display area 1b. For example, the patterned area 231 may coincide with the light-transmitting display area 1b. The patterned area 231 includes a plurality of cathode structures 23a which are spaced apart from each other. An orthographic projection of each of the cathode structures 23a onto the substrate 10 covers an orthographic projection of the light-emitting structure 22a of at least one of the OLED devices 20a onto the substrate 10. By setting at least partial cathode layer as patterned cathodes (i.e., the cathodes including a patterned area), the light transmittance of the display panel at the patterned area can be greatly increased.

For example, as shown in FIG. 2, the orthographic projection of each of the cathode structures 23a onto the substrate 10 covers the orthographic projection of the light-emitting structure 22a of one OLED device 20a onto the substrate 10 (i.e., each OLED device in the patterned area corresponds to one cathode structure). Therefore, the cathodes of the respective pixel units (that is, between each two OLED devices) are disconnected, which can realize the independent power supply to individual OLED devices and in turn greatly alleviate the excessive IR drop issue caused by the entire cathode layer, thereby removing the main limiting factors of applying OLED display panel on a large screen.

As shown in FIG. 2, the display panel further includes a pixel defining layer 40. The pixel defining layer 40 defines a plurality of openings, wherein at least part of each OLED device 20a is disposed in a corresponding opening. In some embodiments of the present disclosure, at least part of each cathode structure 23a is laid on a surface of the pixel defining layer 40.

It should be noted that, as shown in FIG. 3, the patterned area 231 is a partial area of the cathode layer. Except for the patterned area 231, the rest of the cathode layer 23 is all non-patterned area 232. In addition, the substrate 10 includes a base, and a light-shielding layer, a buffer layer, a thin film transistor structure layer and other structures that are sequentially arranged on a surface of the base.

Figure 4:
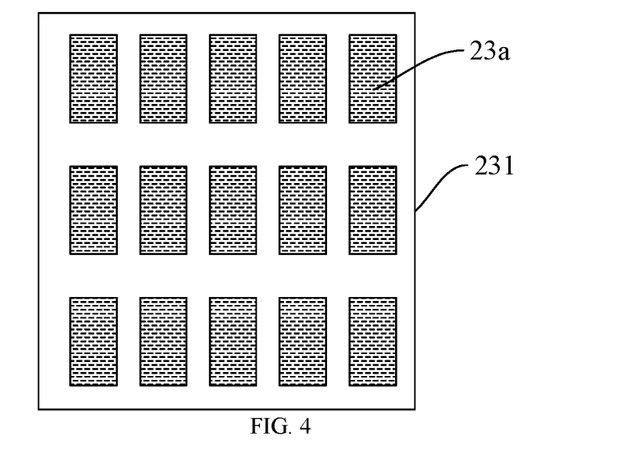
FIG. 4 is a plan view schematic structural diagram of another cathode layer according to an embodiment of the present disclosure.

FIG. 4 is a schematic structural diagram of a cathode layer according to an embodiment of the present disclosure. Referring to FIG. 4, the entire display area of the display panel is a light-transmitting display area, and the patterned area 231 occupies the entire display area of the display panel. In this way, the light transmittance of the entire display panel can be increased, which in turn improves the display quality of the display panel. In addition, the patterned cathode layer can further reduce the interference on touch signals.

In some examples, each OLED device within the patterned area 231 is independently encapsulated. In this way, in a bendable display screen, the encapsulation reliability of the OLED devices in a bent area can be greatly improved.

Figure 5:
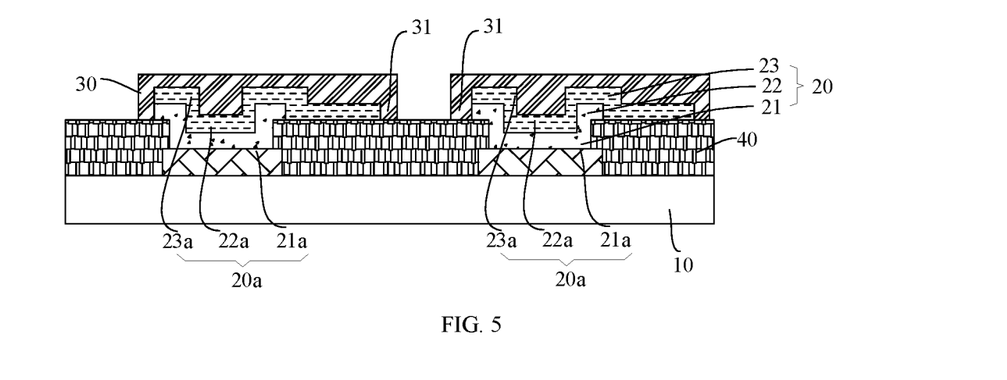
FIG. 5 is a schematic diagram showing a laminated structure of another display panel according to an embodiment of the present disclosure.

According to an embodiment of the present disclosure, referring to FIG. 5, the display panel further includes an encapsulating layer 30. The encapsulating layer includes a plurality of encapsulating structures 31 which are spaced apart from each other and are in one-to-one correspondence with the plurality of cathode structures 23a. An orthographic projection of each of the encapsulating structures 31 onto the substrate 10 covers the orthographic projection of the corresponding cathode structure 23a onto the substrate 10. Thus, in the patterned area, one or more OLED devices may be encapsulated together. That is, the encapsulating layer in the patterned area is also of a patterned structure. In this way, when the display panel is applied to the bendable display screen, by disposing the patterned area in the bent area of the bendable display screen, the encapsulation reliability of the bent area can be improved.

It should be noted that, as described above, in the non-patterned area 232, the cathode layer 23 is occupied with cathode structures over the whole layer, and thus the encapsulating layer 30 is occupied with the encapsulating structures over the whole layer. That is, all the OLED devices in the non-patterned area are integrally encapsulated.

When the orthographic projection of each of the cathode structures 23a onto the substrate covers the orthographic projection of the light-emitting structure 22a of one OLED device onto the substrate, each pixel unit in the patterned area can be independently encapsulated, thereby realizing a pixel-level encapsulation.

Optionally, in some embodiments of the present disclosure, the display panel further includes a plurality of wirings and a VSS signal line that are connected with each other, wherein at least part of the VSS signal line is disposed on an edge of the display panel. Each of the cathode structures is provided with one corresponding wiring, so as to be further connected to the VSS signal line through the corresponding wiring.

Figure 6:
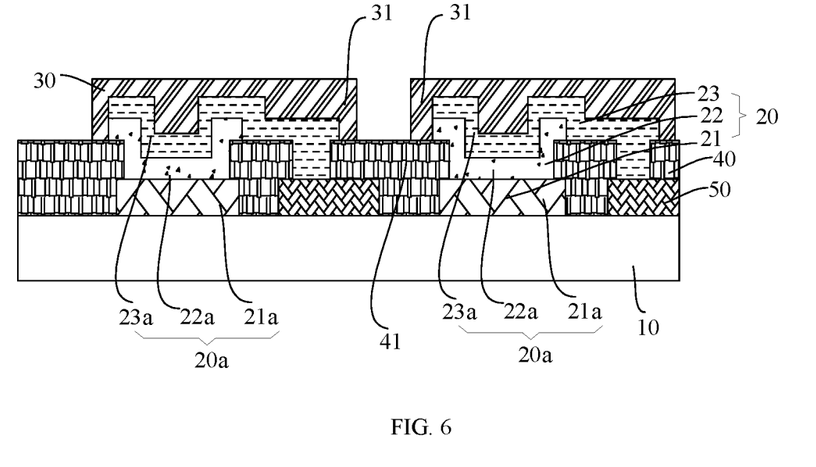
FIG. 6 is a schematic diagram showing a laminated structure of yet another display panel according to an embodiment of the present disclosure.

In some embodiments, referring to FIG. 6, the wirings include first wirings 41. Each cathode structure 23a is provided with one corresponding first wiring 41, and the first wirings 41 are configured to connect the respective cathode structures 23a and the VSS signal lines (not shown in the figure). In this way, the electrical connection between the OLED devices and the VSS signal lines in the patterned area can be realized effectively. Exemplarily, as shown in FIG. 5, the first wirings 41 are disposed in the same layer as the anodes 21a. In other words, the first wirings 41 and the anodes 21 are manufactured by a same process step. In this way, the process flows can be simplified, and the production cost can be reduced.

Continuously referring to FIG. 6, the display panel further includes a pixel defining layer 40, which is disposed on the substrate 10. The pixel defining layer 40 defines a plurality of openings, wherein at least part of each of OLED devices 20a is disposed in a corresponding opening. In some embodiments of the present disclosure, at least part of each cathode structure 23a overlaps with a surface of the pixel defining layer 40. The pixel defining layer 40 is provided with via holes that penetrate through the pixel defining layer 40, wherein a part of the surface of each first wiring 41 is exposed by the corresponding via hole. The first wirings 41 are connected to corresponding cathode structures 23a through the via holes.

Figure 7:
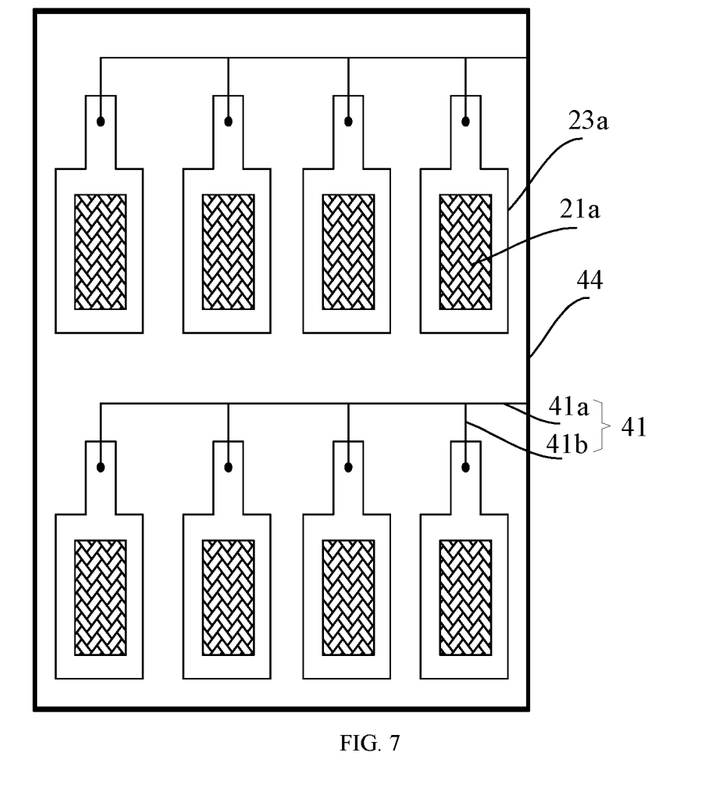
FIG. 7 is a schematic diagram of a connecting structure between a VSS signal line and cathode structures according to an embodiment of the present disclosure.

In some examples, referring to FIG. 7, the VSS signal line 44 is disposed as surrounding the display area 1, and the cathode structures 23a are electrically connected to the VSS signal line 44 through the first wirings 41.

It should be noted that, in some other embodiments, the VSS signal line is disposed in the peripheral area of the display panel, and also disposed on a part of a side edge of the display area 1.

Exemplarily, each first wiring 41 includes a main trunk 41a and a plurality of branches 41b, wherein one end of each branch 41b is connected to the trunk 41a, and the other end of the branch 41b is connected to one corresponding cathode structure 23a. In an example, the trunk 41a extends along a row direction of the display panel.

Figure 8:
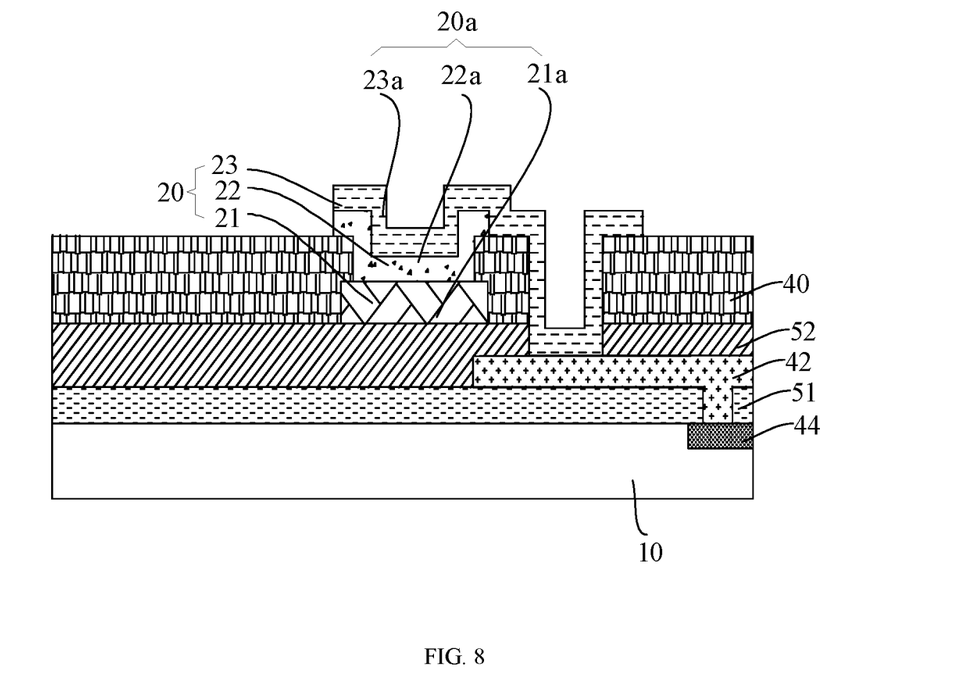
FIG. 8 is a schematic diagram showing a laminated structure of yet another display panel according to an embodiment of the present disclosure.

In some other embodiments, referring to FIG. 8, a first planarization layer 51 and a second planarization layer 52 are disposed between the substrate 10 and the OLED device 20a, wherein the second planarization layer 52 is disposed closer to the OLED device 20a, that is, the second planarization layer 52 is closer to the light-emitting structure layer 20. In FIG. 8, each cathode structure 23a is provided with one corresponding second wiring 42 which is disposed between the first planarization layer 51 and the second planarization layer 52. The second wiring 42 is configured to connect the cathode structure 23a and the VSS signal line 44. As shown in FIG. 8, the second wiring 42 is connected to the VSS signal line 44 through a via hole that penetrates through the second planarization layer and the pixel defining layer 40.

According to an embodiment of the present disclosure, referring to FIG. 8, the second wirings 42 are disposed on a surface of the first planarization layer 51 distal from the substrate 10. The second planarization layer 52 is disposed on the surface of the first planarization layer 51 distal from the substrate 10, and covers the second wirings 42.

Exemplarily, the second wirings are transparent wirings which are, for example, made of a transparent conductive material. The transparent conductive material includes, but is not limited to, ITO, AZO or the like. Therefore, compared with the technical solution shown in FIG. 5 in which the first wirings 41 that are made of the same structural material as the material layer of anodes (generally, the material of the anodes is ITO/Ag/ITO) are used to electrically connect to the VSS signal line 44, by disposing the transparent second wirings 42 to electrically connect the VSS signal line 44 as shown in FIG. 8 (that is, by using the second wirings to replace the first wirings), the light transmittance of the display panel can be further increased, thereby further improving the shooting quality of the camera under panel.

The display panel further includes a pixel defining layer 40. The pixel defining layer 40 is disposed on a surface of the second planarization layer 52 distal from the substrate 10 and defines a plurality of openings, wherein at least part of each OLED device 20a is disposed in a corresponding opening. In this embodiment of the present disclosure, at least part of each cathode structure 23a is laid on a surface of the pixel defining layer 40. The second planarization layer 52 and the pixel defining layer 40 are respectively provided with via holes that penetrate through the second planarization layer 52 and the pixel defining layer 40, wherein at least partial surface of the second wirings 42 is exposed by the corresponding via holes. The second wirings 42 are electrically connected to the cathode structures 23a through the via holes 23a.

Figure 9:
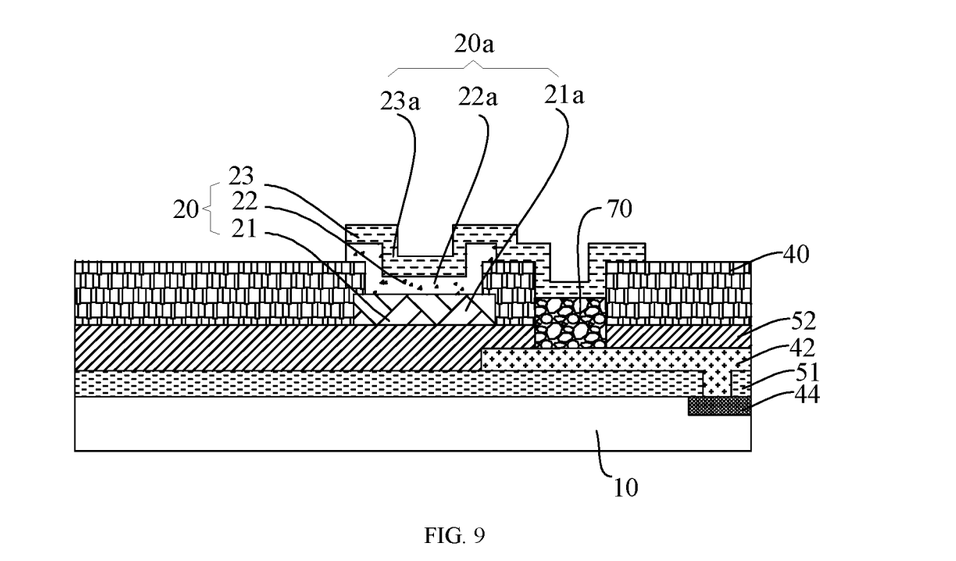
FIG. 9 is a schematic diagram showing a laminated structure of yet another display panel according to an embodiment of the present disclosure.

In some examples, as shown in FIG. 9, the display panel further includes a conductive structure layer 70 which is disposed in the via holes and electrically connected to the second wirings 42 and the cathode structures 23a respectively. That is, the cathode structures 23a are electrically connected to the second wirings 42a through the conductive structure layer 70. The conductive structure layer 70 can reduce a drop height of the cathode structures in the via holes, thereby improving the connection reliability of the cathode structures.

According to an embodiment of the present disclosure, the conductive structure layer 70 may be disposed in the same layer as the anodes. In other words, the conductive structure layer and the anodes are manufactured by the same process step.

Figure 10:
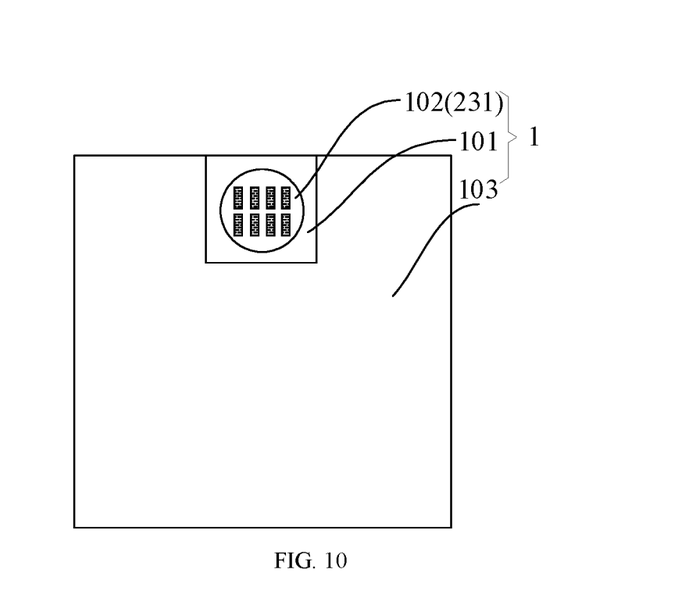
FIG. 10 is a plan view schematic structural diagram of yet another display panel according to an embodiment of the present disclosure.

According to an embodiment of the present disclosure, referring to FIG. 10, the display area 1 of the display panel includes a first display area 101, a second display area 102, and a third display area 103. The first display area 101 surrounds the second display area 102, the third display area 103 surrounds the first display area 101, and the second display area 102 is disposed directly opposite to a camera under panel. That is, at least the second display area 102 is a light-transmitting display area. The patterned area is disposed within the second display area. With respect to a display panel including the camera under panel, by disposing the patterned area within the second display area, the light transmittance of the second display area which is directly opposite to the camera under panel can be effectively increased, thereby improving the shooting quality of the camera.

In some embodiments of the present disclosure, there is no special requirement on shapes of the first display area 101 and the second display area 102, which may be flexibly selected by a person skilled in the art according to actual conditions. In some embodiments, the shapes of the first display area 101 and the second display area 102 include, but are not limited to shapes such as a circle, a rectangle, an ellipse, or irregular shapes. Optionally, the shape of the first display area 101 and the shape of the second display area 102 may be the same or different. In addition, the first display area may contact with an edge side of the display panel, or may not, which may be flexibly selected by a person skilled in the art according to actual needs.

In some embodiments of the present disclosure, the third display area 103 is a normal area with high pixels per inch (PPI). Relative to the PPI of the third display area 103, the first display area 101 and the second display area 102 are areas with low-PPI, which setting can increase the light transmittance of the second display area 102 and ensure the shooting quality of the camera under panel. In addition, in the first display area 101 and the third display area 103, the cathode layer 23 occupies the whole surface structure and no patterned area exists.

Figure 11:
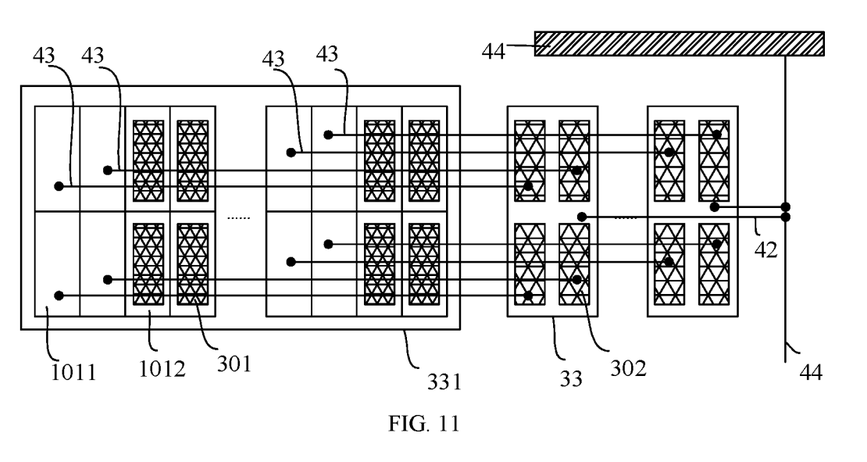
FIG. 11 is a plan view schematic diagram of a partial structure of a display panel according to an embodiment of the present disclosure.
Figure 12:
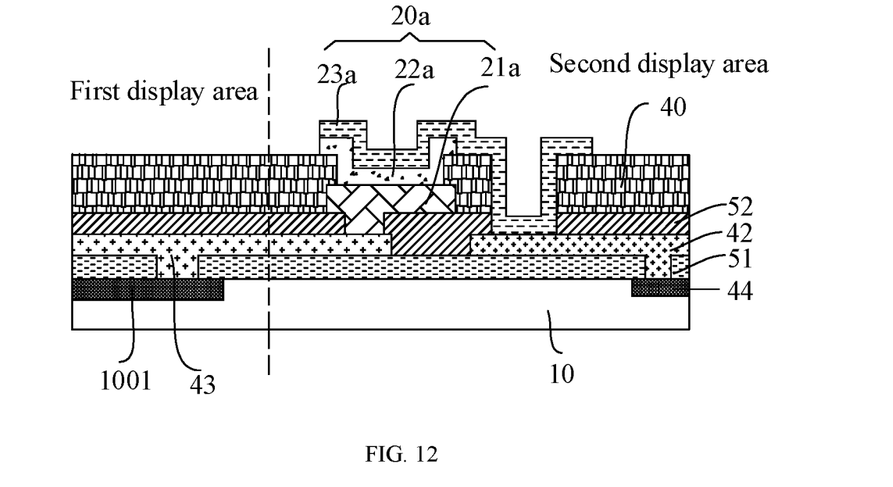
FIG. 12 is a plan view schematic diagram of a partial structure of a display panel according to an embodiment of the present disclosure.

According to an embodiment of the present disclosure, referring to FIG. 11 (in FIG. 11, that a cathode structure 23a covers four OLED devices is taken as an example) and FIG. 12, the first display area 101 includes a first pixel unit 1011 and a second pixel unit 1012. A first pixel circuit is provided in the first pixel unit 1011 (but no OLED device is provided in the first pixel unit 1011), and a second pixel circuit and a first OLED device 301 are provided in the second pixel unit 1012. The second display area 102 is provided with a second OLED device 302 (but no pixel circuit is provided in the second display area). The display panel further includes a plurality of third wirings 43. The plurality of third wirings 43 are configured to electrically connect a drain 1001 of the first pixel circuit and an anode 21a of the second OLED device 302, so as to drive the second OLED device 302 to emit light. No pixel circuit is provided in the second display area, which can further increase the light transmittance in the second display area. In addition, the second OLED device in the second display area is driven by the first pixel circuit in the first display area to emit light, which would not affect a display effect of the second display area.

According to an embodiment of the present disclosure, the first pixel unit 1011 to which the first pixel circuit as connected by a certain third wiring 43 belongs is disposed in a same row as the pixel unit to which the second OLED device connected by the third wiring 43 belongs, which is beneficial to the arrangement of the plurality of third wirings.

According to some embodiments of the present disclosure, the third wirings are transparent wirings. Therefore, the light transmittance in the second display area can be further increased. In an exemplary embodiment, as shown in FIG. 12, the second wirings 42 and the third wirings 43 are disposed in a same layer and not connected with each other (i.e., insulated from each other). Therefore, the process flows can be simplified, and the production cost can be reduced.

There are no special requirements for specific materials of the second wirings and third wirings, as long as they are transparent wirings. In some embodiments, the materials of the second wirings and the third wirings may include, but are not limited to indium tin oxide (ITO) or aluminum-doped zinc oxide (AZO).

As shown in FIG. 11, the VSS signal line 44 extends from the edge of the display panel to the patterned area. That is, the VSS signal line 44 includes a first portion and a second portion. The first portion is disposed on an edge of the display panel, one end of the second portion is connected to the first portion, and the other end of the second portion is disposed in the patterned area. Exemplarily, the second wirings 42 and the third wirings 43 are parallel to each other.

Figure 13:
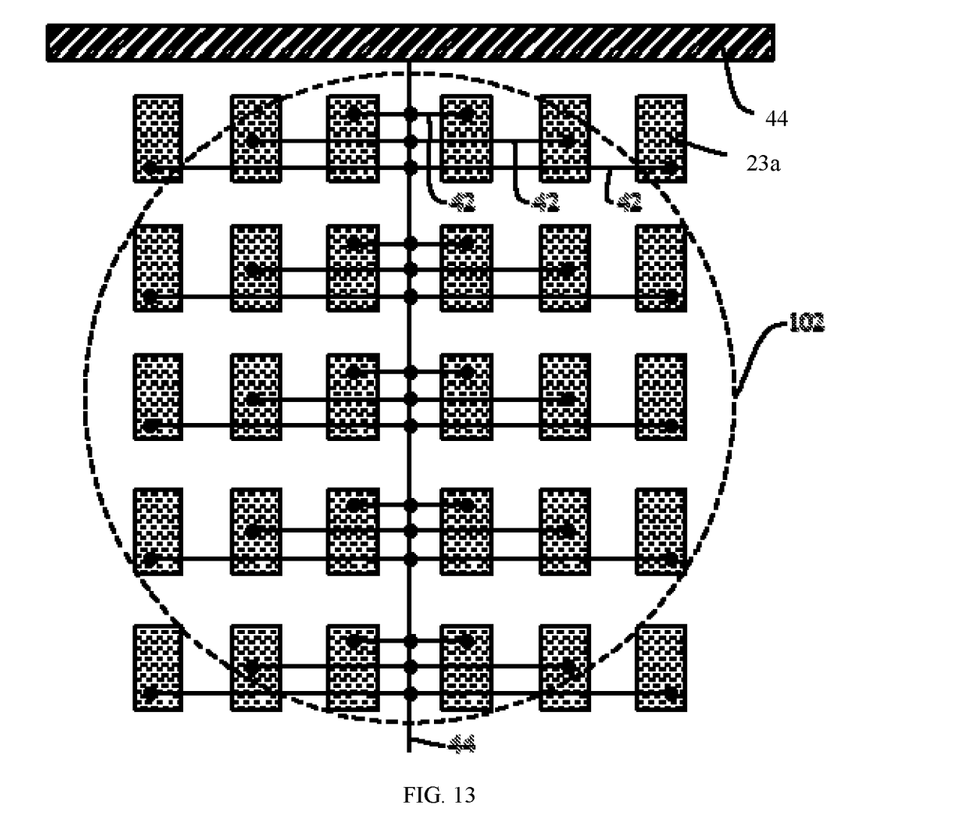
FIG. 13 is a schematic diagram showing a laminated structure of yet another display panel according to an embodiment of the present disclosure.

In some examples, referring to FIG. 13, the VSS signal line 44 is led out from the edge of the display panel, extends to the second display area 102, and is disposed in the middle of the second display area 102. That is, the VSS signal line 44 includes a first portion and a second portion. The first portion is disposed on the edge of the display panel. One end of the second portion is connected to the first portion, and the other end of the second portion is disposed in the second display area 102. In addition, the shape of the second display area 102 is symmetrical with respect to the second portion. A plurality of second OLED devices 302 (FIG. 8 merely shows the cathode structure 23a in each OLED device) are distributed on two sides of the VSS signal line 44. One part of the second wirings 42 are sequentially arranged at intervals in a direction away from the edge, and are electrically connected to the cathode structures 23a of the second OLED devices on one side of the VSS signal line 44 respectively; and the other part of the second wirings 42 are sequentially arranged at intervals in a direction away from the edge, and are electrically connected to the cathode structures 23a of the second OLED devices 302 on the other side of the VSS signal line 44 respectively. As such, the plurality of OLED devices (or a plurality of cathode sub-layers) in the second display area are distributed on two sides of the VSS signal line 44.

In this case, it is more beneficial to the arrangement of the second wirings and the third wirings, and no conflict would incur therebetween. In some embodiments, the plurality of OLED devices (or the plurality of cathode structures) in the second display area can be uniformly distributed on two sides of the VSS signal line 44. In this way, the cathode sub-layers, the second wirings and the third wirings on the two sides of the VSS signal line are symmetrical with respect to the VSS signal line 44, respectively.

In some embodiments, as shown in FIG. 8, FIG. 9 and FIG. 12, the VSS signal line 44 may be disposed in a same layer as a drain 1001 in the pixel circuit of the display panel (that is, formed by the same process as the drain 1001). In some other embodiments, the VSS signal line 44 may be disposed in a same layer as the anode in each OLED device 20a (that is, formed by the same process as the anode).

Some embodiments of the present disclosure further provide a method for manufacturing the display panel as described above. According to some embodiments of the present disclosure, the method includes: forming a light-emitting structure layer on a surface of the substrate 10, wherein the light-emitting structure layer includes a plurality of OLED devices distributed on the substrate. Each OLED device includes a light-emitting structure which includes an anode layer, a light-emitting layer and a cathode layer that are sequentially stacked on the substrate. The cathode layer has a patterned area which is located in a light-transmitting display area of the display panel. The cathode layer in the patterned area includes a plurality of cathode structures which are spaced apart from each other. An orthographic projection of each of the cathode structures onto the substrate covers an orthographic projection of the light-emitting structure of at least one of the OLED devices onto the substrate. Reference can be made to FIGS. 1-3 for the schematic structural diagram thereof. Therefore, by patterning at least part of the cathodes, the light transmittance of the display panel at the patterned area can be greatly increased.

According to some embodiments of the present disclosure, a method for manufacturing the display panel includes: forming an encapsulating layer, wherein the encapsulating layer includes a plurality of encapsulating structures 31 that are spaced apart from each other and are in one-to-one correspondence with the plurality of cathode structures 23a; and the orthographic projection of each of the encapsulating structures 31 onto the substrate covers the orthographic projection of one cathode structure 23a onto the substrate. Reference can be made to FIG. 4 for the schematic structural diagram thereof. Thus, in the patterned area, one or more OLED devices can be encapsulated together. That is, the encapsulating layer in the patterned area is also of a patterned structure. Therefore, in a bendable display screen, the encapsulation reliability in the bent area can be improved by disposing the patterned area in the bent area.

According to some embodiments of the present disclosure, the method for manufacturing the display panel further includes: forming a plurality of first wirings 41, wherein each of the cathode structures 23a is provided with one corresponding first wiring 41. The first wirings are configured to connect the cathode structures 23a and the VSS signal line, wherein the first wirings 41 and the anodes 21a are formed by a same process step. Reference can be made to FIG. 6 for the schematic structural diagram thereof. Therefore, the process flows can be simplified, and the production cost can be reduced.

Figure 14:
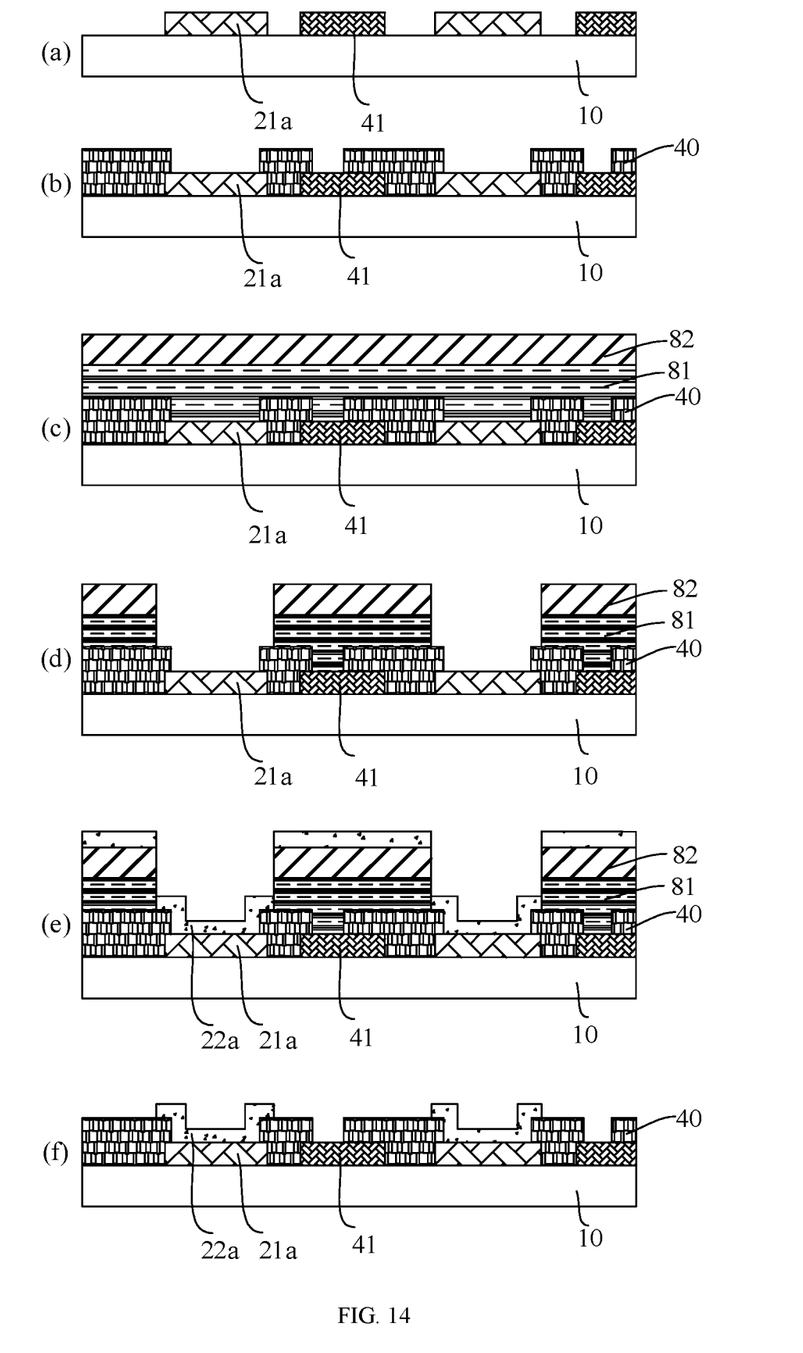
FIG. 14 and FIG. 15 are schematic diagrams showing a process of manufacturing a display panel according to an embodiment of the present disclosure.
Figure 15:
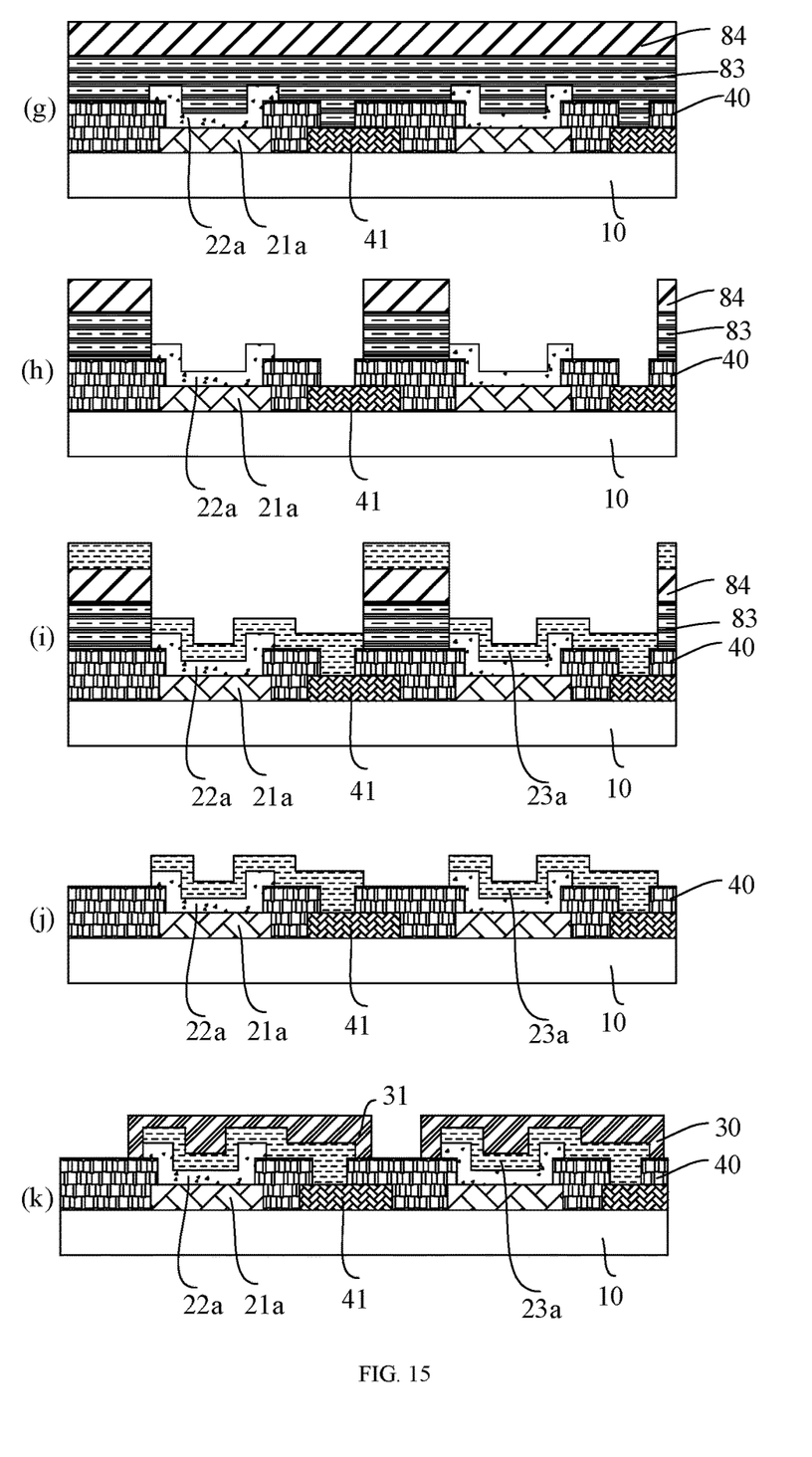

In some embodiments of the present disclosure, referring to FIG. 14 and FIG. 15, the method for manufacturing the display panel includes:

1. forming an anode layer 21 that includes anodes 21a, first wirings 41 and a VSS signal line (not shown in the figure) on a surface of the substrate 10, as shown in part (a) of FIG. 14;
2. forming a pixel defining layer 40 on the substrate 10, wherein the pixel defining layer defines a plurality of openings and via holes. At least partial surface of the anodes 21a is exposed by the openings, and at least partial surface of the first wirings 41 is exposed by the via holes, as shown in part (b) of FIG. 14;
3. coating a surface of the pixel defining layer 40 distal from the substrate 10 with a first protective layer 81 and a first photoresist layer 82 in sequence, wherein the first protective layer 81 and the first photoresist layer 82 cover the exposed surfaces of the anodes 21a and the first wirings 41, as shown in part (c) of FIG. 14;
4. performing exposure and development on the substrate in step 3 through a mask plate, such that the first protective layer 81 and the first photoresist layer 82 expose the surface of the anodes 21a, wherein the developing solution, the protective layer material and the photoresist material used in this step will not negatively affect the display performance of the OLED device of the display panel, as shown in part (d) of FIG. 14; exemplarily, the first protective layer 81 is made of a light-curable molding material, and is removed by the corresponding developing solution;
5. providing a light-emitting layer material on the surfaces of the anodes 21a and the first photoresist layer 82 by vapor deposition, as shown in part (e) of FIG. 14; then, removing the light-emitting layer material on the surface of the first photoresist layer 82, the first protective layer 81 and the first photoresist layer 82 by using a stripping solution, as shown in part (f) of FIG. 14;
6. coating a surface of the pixel defining layer 40 distal from the substrate 10 with a second protective layer 83 and a second photoresist layer 84 in sequence, wherein the second protective layer 83 and the second photoresist layer 84 cover the exposed surfaces of light-emitting structures 22a and the first wirings 41, as shown in part (g) of FIG. 15;
7. performing exposure and development on a predetermined area of the second photoresist layer 84, so as to expose the surface of the light-emitting structures 22a, at least partial surface of the first wirings 41, and the surface of the pixel defining layer 40 between the light-emitting structures 22a and the first wirings 41, as shown in part (h) of FIG. 15;
8. forming a material of cathode layer on the surface of the exposed light-emitting structures 22a, at least partial surface of the first wirings 41, and the surface of the pixel defining layer 40 between the light-emitting structures 22a and the first wirings 41 in step 7, as shown in part (i) of FIG. 15;
9. removing the second protective layer 83, the second photoresist layer 84 and the cathode layer material on the surface of the second photoresist layer 84, as shown in part (j) of FIG. 15; and
10. encapsulating each OLED device provided with the cathode structure 23a independently to obtain an encapsulating structure 31, as shown in part (k) of FIG. 15.

According to some embodiments of the present disclosure, referring to FIG. 6, the display panel includes a first display area 101, a second display area 102, and a third display area 103. The first display area 101 surrounds the second display area 102, the third display area 103 surrounds the first display area 101, and the second display area 102 is disposed directly opposite to a camera under panel. Here, the patterned area is disposed within the second display area. In the display panel including a camera under panel, the light transmittance of the second display area directly opposite to the camera under panel can be effectively increased, thereby improving the shooting quality of the camera.

According to some embodiments of the present disclosure, the method for manufacturing the display panel further includes: forming a first planarization layer 51 on a side of the substrate 10 proximal to the OLED devices; forming a plurality of second wirings 42 on a surface of the first planarization layer 51 distal from the substrate 10, wherein each of the cathode structures 23a is provided with one corresponding second wiring 42, and the second wirings 42 are transparent wirings and are configured to connect the cathode structures 23a and the VSS signal line 44; forming a second planarization layer 52 on a surface of the first planarization layer 51 distal from the substrate 10, wherein the second planarization layer 52 covers the plurality of second wirings 42. Reference can be made to FIG. 7 and FIG. 8 for the schematic structural diagram thereof. As shown in FIG. 7, each second wiring 42 is connected to the VSS signal line 44 through a via hole that penetrates through the second planarization layer and the pixel defining layer 40.

According to some embodiments of the present disclosure, the method for manufacturing the display panel further includes: forming a pixel defining layer 40, the pixel defining layer 40 being disposed on a surface of the second planarization layer 52 distal from the substrate 10 and defining a plurality of openings, wherein the OLED devices are disposed in the openings, and at least part of each cathode structure 23a covers the surface of the pixel defining layer 40; forming via holes, that penetrate through the second planarization layer 52 and the pixel defining layer 40, in the second planarization layer 52 and the pixel defining layer 40, wherein at least partial surface of the second wirings 42 is exposed by the via holes; and forming a conductive structure layer 70, the conductive structure layer 70 being formed in the via holes and electrically connected to the second wirings 42 and the cathode structures 23a respectively. Reference can be made to FIG. 9 for the schematic structural diagram thereof. Therefore, by electrically connecting the cathode structures to the second wirings through the conductive structure layer, a drop height of the cathode structures in the via holes can be reduced, thereby improving the reliability of the cathode structures.

According to some embodiments of the present disclosure, the conductive structure layer 70 and the anodes 21a of the OLED devices are formed through a same process step. In this way, the process flows can be simplified and the cost can be reduced.

According to some embodiments of the present disclosure, referring to FIG. 11, the first display area 101 includes a first pixel unit 1011 and a second pixel unit 1012. A first pixel circuit is provided in the first pixel unit 1011 (but no OLED device is provided in the first pixel unit 1011), and a second pixel circuit and a first OLED device 301 are provided in the second pixel unit 1012. A second OLED device 302 is provided in the second display area 102 (but no pixel circuit is provided in the second display area). The method for manufacturing the display panel further includes: forming a plurality of third wirings 43, the third wirings 43 being configured to electrically connect drains 1001 of the first pixel circuits and anodes 21a of the second OLED devices 302, so as to drive the second OLED devices 302 to emit light. The third wirings 43 and the second wirings 42 are formed by a same process step. Therefore, no pixel circuit is provided in the second display area, which may further increase the light transmittance in the second display area. In addition, the second OLED device in the second display area is driven by the first pixel circuit in the first display area to emit light, which would not affect a display effect of the second display area.

In some specific embodiments of the present disclosure, the method for manufacturing the display panel includes:
1. forming a first planarization layer 51 on a surface of the substrate 10 by deposition, and forming a plurality of via holes, that penetrate through the first planarization layer 51, in the first planarization layer 51, wherein partial surface of the VSS signal line 44 is exposed by one part of the via holes, and partial surface of the drains 1001 of the first pixel unit in the first display area is exposed by the other part of the via holes;
2. forming second wirings 42 and third wirings 43 on a surface of the first planarization layer 51 distal from the substrate, wherein the second wirings 42 are electrically connected to the VSS signal line 44 through the via holes, and the third wirings 43 are electrically connected to the drains 1001 through the via holes;
3. forming a second planarization layer 52 on a side of the first planarization layer distal from the substrate by deposition, wherein the second planarization layer 52 covers the second wirings 42 and the third wirings 43;
4. forming a plurality of via holes, that penetrate through the second planarization layer 52, in the second planarization layer 52, wherein partial surface of the second wirings is exposed by one part of the via holes, and partial surface of the third wirings is exposed by the other part of the via holes;
5. forming a pixel defining layer 40 on a surface of the second planarization layer 52 distal from the substrate, the pixel defining layer defining a plurality of openings;
6. forming an anode 21a in each opening by vacuum vapor deposition, wherein the anode is electrically connected to the third wirings through the via holes formed in step 4;
7. forming a light-emitting layer 22 on a side of each anode 21a distal from the substrate 10 by vapor deposition; and
8. forming a cathode material layer on a side of the light-emitting layer 22 distal from the substrate 10 by deposition, and patterning the cathode material layer in the second display area 102 to acquire a cathode layer including a plurality of cathode structures 23a, wherein the cathode structures 23a are electrically connected to the second wirings through the via holes formed in step 4. Reference can be made to FIG. 11 for the schematic structural diagram thereof.

Some embodiments of the present disclosure further provide a display apparatus. The display apparatus includes any one of the display panels as described above. The display apparatus further includes a power supply component configured to supply power to the display panel.

Exemplarily, the display apparatus may be any product or component having a display function, such as a mobile phone, a tablet computer, a television, a display, a laptop computer, a digital photo frame or a navigator.

The terms "first" and "second" are only for the purpose of description and should not be construed as indicating or implying relative importance or implicitly indicating the number of technical features indicated. Thus, the features defined by the terms "first" and "second" may include one or more of the features either explicitly or implicitly. In the description of the present disclosure, unless otherwise stated, the term "a plurality of" means two or more.

In the present disclosure, unless otherwise definitely specified and limited, by indicating that a first feature is provided "above" or "below" a second feature, it may mean that the first feature is in direct contact with the second feature, or the first feature is indirectly in contact with the second feature via an intermediation. Moreover, the first feature being provided "over", "above", or "on" the second feature may mean that the first feature is provided directly above or diagonally above the second feature, or merely means that a horizontal level of the first feature is higher than that of the second feature. The first feature being provided "under", "below", and "beneath" the second feature may mean that the first feature is provided directly below or diagonally below the second feature, or merely means that a horizontal level of the first feature is lower than that of the second feature.

In the description of the present specification, the reference terms such as "an embodiment". "some embodiments", "an example", "a specific example" or "some examples"

means that the particular features, structures, materials or characteristics described in combination with the embodiment(s) or example(s) are included in at least one embodiment or example of the present disclosure. In the description, schematic description of the above terms does not necessarily refer to the same embodiment or example. Furthermore, the described particular features, structures, materials or characteristics may be combined in any suitable manner in any one or more embodiments or examples. In addition, in the absence of contradiction, a person skilled in the art may integrate and combine different embodiments or examples described in this specification and the features of different embodiments or examples.

Although the above embodiments of the present disclosure have been shown and described, it should be understood that the above embodiments are exemplary and should not be construed as limiting the present disclosure. A person of ordinary skill in the art may make changes, modifications, substitutions and modifications to the above-mentioned embodiments within the scope of the present disclosure.

What is claimed is:

1. A display panel, comprising a substrate and a light-emitting structure layer, wherein the light-emitting structure layer comprises a plurality of OLED devices distributed on the substrate; each OLED device has a light-emitting structure which comprises an anode layer, a light-emitting layer and a cathode layer that are sequentially stacked on the substrate; the cathode layer has a patterned area; the patterned area of the cathode layer comprises a plurality of cathode structures which are spaced apart from each other; an orthographic projection of each of the cathode structures onto the substrate covers an orthographic projection of the light-emitting structure of at least one of the OLED devices onto the substrate; and
   wherein the patterned area is located in a light-transmitting display area of the display panel;
   a display area of the display panel comprises a first display area, a second display area, and a third display area, the first display area surrounding the second display area and the third display area surrounding the first display area; the second display area is disposed directly opposite to a camera under panel; and the patterned area is located in the second display area; and
   the first display area comprises a first pixel unit and a second pixel unit, wherein the first pixel unit comprises a first pixel circuit, and the second pixel unit comprises a second pixel circuit and a first OLED device; the second display area comprises a third pixel unit which comprises a second OLED device, wherein one of the plurality of cathode structures covers at least one second OLED device; and the display panel further comprises:
   a plurality of third wirings configured to connect the first pixel circuit to the second OLED device corresponding to the first pixel circuit.

2. The display panel according to claim 1, wherein the orthographic projection of each of the cathode structures onto the substrate covers the orthographic projection of the light-emitting structure of one of the OLED devices onto the substrate.

3. The display panel according to claim 1, further comprising:
   a plurality of wirings and a VSS signal line that are connected with each other, wherein at least part of the VSS signal line is disposed on an edge of the display panel; and each of the cathode structures is connected to one corresponding wiring, so as to be connected to the VSS signal line through the connected wiring.

4. The display panel according to claim 3, wherein the wirings comprise first wirings which are disposed in a same layer as the anode layer; and the display panel further comprises:
   a pixel defining layer, wherein the pixel defining layer is disposed on the substrate and defines a plurality of openings, and at least part of each OLED device is disposed in a corresponding opening; at least part of each cathode structure is disposed on a surface of the pixel defining layer; the pixel defining layer is provided with via holes that penetrate through the pixel defining layer; and the first wirings are connected to corresponding cathode structures through the via holes.

5. The display panel according to claim 3, wherein the wirings comprise second wirings; and the display panel further comprises a first planarization layer, a second planarization layer and a pixel defining layer;
   the first planarization layer and the second planarization layer are disposed between the substrate and the OLED devices, and the second planarization layer is disposed closer to the OLED devices; the second wirings are disposed between the first planarization layer and the second planarization layer;
   the pixel defining layer is disposed on a surface of the second planarization layer distal from the substrate and defines a plurality of openings; at least part of each OLED device is disposed in a corresponding opening, and at least part of each cathode structure is disposed on a surface of the pixel defining layer; the second planarization layer and the pixel defining layer are provided with via holes that penetrate through the second planarization layer and the pixel defining layer; and the second wirings are connected to corresponding cathode structures through the via holes.

6. The display panel according to claim 5, wherein the VSS signal line extends from the edge of the display panel to the patterned area; the plurality of cathode structures are distributed on both sides of the patterned area located in the light-transmitting display area; one part of the second wirings are sequentially arranged at intervals along a direction away from the edge, and are respectively connected to the cathode structures on one side of the VSS signal line, and the other part of the second wirings are sequentially arranged at intervals along a direction away from the edge, and are respectively connected to the cathode structures on the other side of the VSS signal line.

7. The display panel according to claim 5, wherein the second wirings are transparent wirings.

8. The display panel according to claim 5, further comprising:
   a conductive structure layer, wherein the conductive structure layer is disposed in the via holes and connected to the second wirings and the cathode structures respectively.

9. The display panel according to claim 8, wherein the conductive structure layer is disposed in a same layer as the anode layer.

10. The display panel according to claim 1, wherein the third wirings are transparent wirings.

11. The display panel according to claim 10, wherein the second wirings and the third wirings are disposed in a same layer and insulated from each other.

12. The display panel according to claim 1, further comprising an encapsulating layer, wherein the encapsulating layer comprises a plurality of encapsulating structures which are spaced apart from each other and are in one-to-one correspondence with the plurality of cathode structures; and an orthographic projection of each of the encapsulating structures onto the substrate covers an orthographic projection of one corresponding cathode structure onto the substrate.

13. The display panel according to claim 1, wherein the patterned area comprises an entire display area of the display panel, and the orthographic projection of each of the cathode structures onto the substrate covers the orthographic projection of the light-emitting structure of one of the OLED devices onto the substrate; and
the display panel further comprises an encapsulating layer, a VSS signal line and a plurality of first wirings; wherein
the encapsulating layer comprises a plurality of encapsulating structures which are spaced apart from each other and in one-to-one correspondence with the plurality of cathode structures; the orthographic projection of each of the encapsulating structures onto the substrate covers the orthographic projection of one corresponding cathode structure onto the substrate;
at least part of the VSS signal line is disposed on an edge of the display panel; and
the first wirings are disposed in a same layer as the anode layer; and each of the cathode structures is connected to one corresponding first wiring, so as to be connected to the VSS signal line through the connected first wiring.

14. A method for manufacturing a display panel, the method comprising:
forming a light-emitting structure layer on a surface of a substrate, wherein the light-emitting structure layer comprises a plurality of OLED devices distributed on the substrate; each OLED device has a light-emitting structure which comprises an anode layer, a light-emitting layer and a cathode layer that are sequentially stacked on the substrate; and
the cathode layer has a patterned area which is located in a light-transmitting display area of the display panel; the cathode layer in the patterned area comprises a plurality of cathode structures that are spaced apart from each other; and an orthographic projection of each of the cathode structures onto the substrate covers an orthographic projection of the light-emitting structure of at least one of the OLED devices onto the substrate;
wherein the display panel comprises a first display area, a second display area, and a third display area, the first display area surrounding the second display area, the third display area surrounding the first display area, and the second display area being opposite to a camera under panel; the patterned area is located in the second display area; the first display area comprises a first pixel unit and a second pixel unit, wherein the first pixel unit comprises a first pixel circuit, and the second pixel unit comprises a second pixel circuit and a first OLED device; the second display area comprises a third pixel unit which comprises a second OLED device, wherein one of the plurality of cathode structures covers at least one second OLED device; and the method further comprises:
forming a plurality of third wirings, the plurality of third wirings being configured to electrically connect the first pixel circuit to the second OLED device corresponding to the first pixel circuit.

15. The method according to claim 14, further comprising:
forming an encapsulating layer on the light-emitting structure layer, wherein the encapsulating layer comprises a plurality of encapsulating structures which are spaced apart from each other and are in one-to-one correspondence with the plurality of cathode structures; and an orthographic projection of each of the encapsulating structures onto the substrate covers an orthographic projection of one corresponding cathode structure onto the substrate.

16. The method according to claim 14, further comprising:
forming a first planarization layer on a side of the substrate proximal to the OLED devices;
forming a plurality of second wirings on a surface of the first planarization layer distal from the substrate, wherein each of the cathode structures is provided with one corresponding second wiring, and the second wirings are configured to connect the cathode structures to the VSS signal line;
forming a second planarization layer on a surface of the first planarization layer distal from the substrate, wherein the second planarization layer covers the plurality of second wirings;
forming a pixel defining layer on a surface of the second planarization layer distal from the substrate, wherein the pixel defining layer defines a plurality of openings; the OLED devices are disposed in the openings, and at least part of each cathode structure overlaps with a surface of the pixel defining layer; and
forming via holes penetrating through the second planarization layer and the pixel defining layer, in the second planarization layer and the pixel defining layer, wherein at least partial surface of each second wiring is exposed by a corresponding via hole.

17. The method according to claim 16, further comprising:
forming a conductive structure layer in the via holes, wherein the conductive structure layer is electrically connected to the second wirings and the cathode structures respectively.

18. A display apparatus, comprising a display panel and a power supply component configured to supply power to the display panel, wherein the display panel comprises a substrate and a light-emitting structure layer, the light-emitting structure layer comprises an anode layer, a light-emitting layer and a cathode layer that are sequentially stacked on the substrate; the light-emitting structure layer comprises a plurality of OLED devices distributed on the substrate; each OLED device has a light-emitting structure; the cathode layer has a patterned area; the cathode layer in the patterned area comprises a plurality of cathode structures which are spaced apart from each other; an orthographic projection of each of the cathode structures onto the substrate covers an orthographic projection of the light-emitting structure of at least one of the OLED devices onto the substrate;
wherein the patterned area is located in a light-transmitting display area of the display panel;
a display area of the display panel comprises a first display area, a second display area, and a third display area, the first display area surrounding the second display area and the third display area surrounding the first display area; the second display area is disposed directly opposite to a camera under panel; and the patterned area is located in the second display area; and
the first display area comprises a first pixel unit and a second pixel unit, wherein the first pixel unit comprises a first pixel circuit, and the second pixel unit comprises a second pixel circuit and a first OLED device; the second display area comprises a third pixel unit which comprises a second OLED device, wherein one of the plurality of cathode structures covers at least one second OLED device; and the display panel further comprises:

a plurality of third wirings configured to connect the first pixel circuit to the second OLED device corresponding to the first pixel circuit.

* * * * *